(12) United States Patent
Martelloni

(10) Patent No.: US 7,183,816 B2
(45) Date of Patent: Feb. 27, 2007

(54) CIRCUIT AND METHOD FOR SWITCHING AN ELECTRICAL LOAD ON AFTER A DELAY

(75) Inventor: Yannick Martelloni, Poing (DE)

(73) Assignee: Infineon Technologies AG, Munich (DE)

(*) Notice: Subject to any disclaimer, the term of this patent is extended or adjusted under 35 U.S.C. 154(b) by 189 days.

(21) Appl. No.: 10/997,206

(22) Filed: Nov. 24, 2004

(65) Prior Publication Data

US 2005/0116753 A1 Jun. 2, 2005

(30) Foreign Application Priority Data

Nov. 27, 2003 (DE) ................. 103 55 509

(51) Int. Cl.
*H03B 1/10* (2006.01)
(52) U.S. Cl. .................. 327/112; 327/404; 326/87
(58) Field of Classification Search .......... 326/26, 326/27, 31, 33, 34, 85, 87, 91; 327/108, 327/109, 110, 111, 112, 403, 404
See application file for complete search history.

(56) References Cited

U.S. PATENT DOCUMENTS

| 4,779,013 A * | 10/1988 | Tanaka | 326/27 |
| 4,829,199 A * | 5/1989 | Prater | 326/27 |
| 5,057,711 A * | 10/1991 | Lee et al. | 326/27 |
| 5,122,690 A * | 6/1992 | Bianchi | 326/87 |
| 5,166,555 A * | 11/1992 | Kano | 326/87 |
| 5,483,177 A | 1/1996 | Van Lieverloo | 326/27 |
| 5,534,791 A * | 7/1996 | Mattos et al. | 326/27 |
| 5,877,647 A * | 3/1999 | Vajapey et al. | 327/391 |
| 5,914,618 A * | 6/1999 | Mattos | 326/87 |
| 6,069,486 A | 5/2000 | Manyoki et al. | 326/27 |
| 6,184,729 B1 * | 2/2001 | Pasqualini | 327/112 |
| 6,310,468 B1 | 10/2001 | Feldtkeller | 323/282 |
| 6,313,664 B1 * | 11/2001 | Hall et al. | 326/83 |
| 6,563,293 B2 | 5/2003 | Marino et al. | 323/272 |
| 6,842,058 B2 * | 1/2005 | McNitt et al. | 327/170 |
| 6,924,669 B2 * | 8/2005 | Itoh et al. | 326/87 |
| 2002/0125866 A1 | 9/2002 | Hamon et al. | 323/280 |

FOREIGN PATENT DOCUMENTS

| DE | 3538584 C2 | 2/1989 |
| DE | 19743284 C1 | 3/1999 |
| EP | 1050951 A2 | 11/2000 |
| EP | 1172923 A1 | 1/2002 |

* cited by examiner

*Primary Examiner*—Jeffrey Zweizig
(74) *Attorney, Agent, or Firm*—Baker Botts L.L.P.

(57) ABSTRACT

A circuit (S1) for switching on an electrical load which can be connected downstream from the circuit comprises a first electronic switching means (T1) in a first path, and a second electronic switching means (T2) in a second path, which is in parallel with it. The circuit also has a means (INV, OR, T5) for producing the electrical control variable ($U_{gate2}$) for the second switching means (T2), which determines the control variable ($U_{gate2}$) as a function of an electrical variable ($U_{o,d}$) which occurs on the output side of the first switching means (T1) when switching on a load which can be connected downstream.

22 Claims, 4 Drawing Sheets

CIRCUIT AND METHOD FOR SWITCHING AN ELECTRICAL LOAD ON AFTER A DELAY

PRIORITY

This application claims priority to German application no. 103 55 509.9 filed Nov. 27, 2003.

TECHNICAL FIELD OF THE INVENTION

The present invention relates to a circuit and to a method for switching on an electrical load.

BACKGROUND OF THE INVENTION

In circuits in which the power losses are low, in particular monolithically integrated circuits, the only circuit blocks in the circuit which are frequently switched on are those which are required to ensure the circuit operation at that time. Those circuit blocks which are not required are switched off. Particularly in the case of battery-powered appliances, in which circuits with low power losses such as these are used, this increases the time for which the appliances may be operated.

In order to switch off the circuit blocks which are not required, these circuit blocks can be deliberately decoupled from the supply voltage. When the circuit blocks are required for a specific function of the circuit, they are recoupled to the supply voltage. Electronic switching means, in particular MOSFET transistors (Metal Oxide Semiconductor Field Effect Transistors), are used for coupling purposes, and are arranged between one pole of the supply voltage and the corresponding supply connection of the circuit block.

In general, switching means such as these must be designed such that only a small voltage drop occurs across the switching means during operation of that part of the circuit, so that the supply voltage which is effectively applied to the circuit block is reduced only slightly. This means that the electrical resistance of the switching means when in the switched-on state $R_{on}$ must be as small as possible, particularly in the case of large quiescent supply currents or large mean supply currents. Transistors used as switching means therefore have very large areas. In a MOSFET transistor with a correspondingly large area, there is a small resistance $R_{T,on}$ between the drain connection and the source connection when the transistor is in the switched-on state. One disadvantage of a MOSFET transistor with a correspondingly large area is its large parasitic capacitances, whose charge must first of all be changed when the MOSFET transistor is switched on. When the MOSFET transistor is switched on, it briefly requires a very high charge-changing or charging current from the supply voltage. The briefly very high charging current results in an additional voltage being dropped across resistances located upstream of the input of the switching means and in the direction of the pole of the supply voltage, in particular parasitic resistances such as the internal resistance of the supply voltage or the resistance of the bonding wire for the supply voltage, thus interfering with other circuit blocks which are being operated and are fed via the same voltage supply. In this case, the effective available supply voltage for these circuit elements is briefly reduced, thus reducing the signal-to-noise ratio for digital circuits. In this case, circuit blocks which are placed densely on the switch and on the circuit block to be switched on are particularly subject to interference since, in the layout of a monolithically integrated circuit, these frequently have a common supply voltage path, which is formed via resistive metallization, with a corresponding line resistance. If this voltage drop relates to the earth of the supply voltage, this is referred to in American English as a so-called "ground bounce".

The charging process may be extended over a longer time period, in order to reduce the maximum charging current. In this case, the maximum charging current is reduced. This can be done by using a large number of corresponding smaller transistors arranged in parallel instead of one switching means comprising a large-area transistor, for example four transistors connected in parallel. These smaller transistors are switched on successively in order to switch on the circuit block. In this case, the time which passes while the transistors are being switched on ensures that the drive for the transistor which is in each case being switched on at a later time is delayed by using an appropriate delay element with a fixed time delay with respect to the drive for the transistor which is switched on before it. A procedure such as this has the disadvantage that the time delay caused by the delay elements is generally shorter, assuming an acceptable degree of circuit complexity, than the time delay which is governed by the time constant of the parasitic element involved in the switching-on process, such as the line resistance of the supply voltage feed and the effective network capacitance of the supply voltage node upstream or downstream of the group of transistors. The influence in terms of reducing the maximum charging current is therefore frequently insufficient. The maximum charging current can admittedly be reduced considerably by increasing the number of parallel-connected transistors and delay elements or the delay per delay element, but a measure such as this increases the circuit complexity. Furthermore, in principle, the delay of a switch such as this formed from a large number of parallel-connected transistors must be matched to the respective circuit element to be driven via this switch, since the time constant of the switching-on process is dependent on the circuit element to be driven, and its layout. It is therefore also very time-consuming to design a switch such as this.

SUMMARY OF THE INVENTION

The invention is therefore based on the object of specifying a circuit for switching on an electrical load which can be connected downstream from the circuit, which circuit results in a small maximum charging or charge-changing current and, furthermore, can be implemented with little complexity and can be used flexibly. A further aim of the invention is to specify a corresponding method.

The circuit according to the invention for switching on an electrical load which can be connected downstream from the circuit comprises a first electronic switching means in a first path of the circuit, and a second electronic switching means in a second path of the circuit, which is in parallel with the first path. In this case, one input of each switching means is provided for reception of the same pole of a supply voltage which can be connected upstream. Furthermore, one output of each switching means is provided for supplying voltage to the load which can be connected downstream and can be electrically connected via the same switching means to the respective input of the same switching means by closing the switching means as a function of an electrical control variable which is applied via a control input of the respective switching means. The control variable for the control input of the first switching means is controlled by means of an electrical switching variable for switching on the electrical load which can be connected downstream. Furthermore, the circuit has a means for providing the electrical control variable for the second switching means, which determines the control variable as a function of an electrical variable, which occurs on the output side of the first switching means when switching on the load which can be connected downstream.

In this case, by way of example, an electrical potential or an electric current may be used for the electrical variable which occurs on the output side of the first switching means. The expression "output side of the first switching means" should in this case be understood as meaning that the electrical variable may occur—when viewed from the switching means—downstream from the first switching means in the circuit itself, or else in the load. The occurrence of the electrical variable downstream from the second or from a further switching means which is located in a parallel path should also be understood in this sense according to the invention. By way of example, the potential can be used as an input variable for the means for providing the electrical control variable for the second switching means directly at the output of the first switching means or at the internal supply voltage node within the load.

The relationship according to the invention between the control variable for the second switching means and the electrical variable which occurs on the output side of the first switching means makes it possible for the delay in switching on the second switching means to be dependent on the load. Once the first switching means has been switched on, the electrical variable (for example an electrical potential) downstream from the output of the first switching means changes with a specific time constant. This time constant is in general governed primarily by the parasitic switching capacitance of the first switching means, and by the parasitic capacitance of the load. In this case, for the purposes of the invention, it is feasible for the control variable to switch on the second switching means, via the means for providing it, when the electrical variable reaches a specific value. The duration of the delay between switching on the first switching means and switching on the second switching means is thus load-dependent. Furthermore, this relationship has the advantageous characteristic that the delay between switching on the first and the second switching means becomes longer the greater the capacitance of the load. A long delay thus has a limiting effect on the maximum charging current, which is in principle greater, for a highly capacitive load. To this extent, the circuit according to the invention matches the delay between switching on the two switching means, and thus the process of switching on the load, automatically and in a suitable manner to the circuit load to be driven, so that the circuit can be used flexibly, without adaptation.

Furthermore, in the case of the circuit according to the invention, the delay duration (despite the low-complexity implementation) will in general be longer than if the delay were to be implemented via one or more simple delay buffers with a fixed group delay time between the control inputs of the switching means.

The circuit according to the invention thus ensures that the maximum charging current or charge-changing current and the voltage drop which results from this across the supply voltage feed and across the internal resistance of the supply voltage is reduced in an optimum manner as a function of the load. Other circuits which are operated via the same supply voltage are therefore influenced only slightly by switching on the load which is connected downstream from the circuit.

The electrical variable which occurs on the output side of the first switching means is advantageously an electrical potential. The following statements in the description relating to the use of an electrical potential may, however, in general be transferred in an analogous manner to the use of an electric current.

According to one advantageous embodiment, the first switching means is a first transistor element and the second switching means is a second transistor element. In this case, the expression "transistor element" refers, for the purposes of the invention, either just to one transistor or to two or more transistors, which in this case are arranged in parallel.

In this case, it is advantageous for the first transistor element to have a lower switching capacitance than the second transistor element. This is because, in this case, the maximum charging current is once again considerably reduced in comparison to the use of two transistor elements with the same switching capacitance. Until the second transistor element is switched on, the time for which is governed by the delay according to the invention, only the first transistor element is involved in the process of switching on the load. During this first phase, the proportion of the parasitic network capacitance which occurs at the output of the circuit and is caused by the switching means and the load is low, since the first transistor element has a low switching capacitance, and this is the only one that is switched on. Thus, during this phase, the maximum charging current is low, particularly if the delay time is long. If the potential at the supply voltage node within the load before the second transistor element is switched on is already in the vicinity of the steady-state final value, or already corresponds to the steady-state final value, the subsequent potential change in the second phase after a second transistor element with the greater capacitance is switched on is small. In consequence, the change in charge and thus the maximum charging current are small, even during this second phase. The use of a transistor element with a high switching capacitance for the second switching means is in this case associated with a generally larger transistor element area and generally lower resistance $R_{T2,on}$ in the switched-on state between the transistor element connections which correspond to the input of the switching means and to the output of the switching means. This is true, at least when using transistors of the same transistor type. This means that, in the steady state once the second transistor element has been switched on, the resistor $R_{on}$ between the input and the output of the circuit is low, and corresponds approximately to the resistance $R_{T2,on}$ (provided that, for the resistance of the first switching means: $R_{T1,on} \gg R_{T2,on}$). To this extent, this measure results in a functional split: the first switching means with a lower capacitance and a high resistance $R_{T1,on}$ is dominant during the switching-on process, while the second switching means with a high capacitance and a low resistance $R_{T2,on}$ possibly as well as further switching means which determine the characteristics of the circuit according to the invention as a switch, is or are dominant during steady-state operation after the switching-on process.

The first transistor element is preferably smaller than the second transistor element, in particular smaller by a factor of at least 2. When using the same or comparable transistor types, a large transistor element has a greater parasitic switching capacitance and less resistance $R_{T,on}$ in the switched-on state than a small transistor element. The above circuit characteristics relating to the use of two transistor elements with different switching capacitances can thus be traded off as appropriate. In this case, the expression transistor type covers, by way of example, the following type-specific characteristics, fundamental transistor type, for example MOSFET, JFET (Junction Field Effect Transistor) or bipolar; semiconductor layer sequence, that is to say P/N-FET or NPN/PNP; normally-on or normally-off type (only in the case of MOS); structure size; production process.

It is advantageous for the means for providing the electrical control variable for the second switching means to be designed such that the second switching means is closed from a specific threshold value of the electrical potential which occurs on the output side of the first switching means, and in a state of the electrical switching variable which is associated with switching on. In this case, the process of closing the switching means may be completed more less abruptly with respect to the potential which occurs. In this case, the means for producing the electrical control variable for the second switching means is advantageously designed such that, in a circuit which connects the load to a positive pole of the supply voltage, the second switching means is closed above a specific threshold value. If the circuit has the function of connecting the load to a negative pole of the supply voltage, then the second switching means is closed below the specific threshold value. The use of a threshold value for the electrical potential offers the capability to produce the means for providing the electrical control variable in a simple manner in digital form, by means of gates which operate digitally.

Advantageously, the means for providing the electrical control variable for the second switching means is designed such that the second switching means is open in a state of the electrical switching variable which is associated with switching off, and independently of the electrical potential which occurs on the output side of the first switching means. In this case, there is no need for the additional switch, which would otherwise be required, for the disconnection of the load from the circuit. If the control variable were governed only by the electrical potential which occurs on the output side of the first switching means, the load on the circuit could not be switched off.

According to one preferred embodiment, the means for providing the electrical control variable has one or more digital gates. Since the circuit makes use of switching means which assume only two steady states, so that only two different steady-state values of the respective control variable are required for the inputs of the switching means, digital gates can be used to implement the circuit, with minimal complexity.

It is advantageous that, in a circuit which connects the load into a positive pole of the supply voltage, the first transistor element and the second transistor element are normally-off P-MOSFET transistor elements, with the gate connection corresponding to the control input, the source connection corresponding to the input of the switching means, and the drain connection of the transistor element corresponding to the output of the switching means. In a circuit, which connects the load to a negative pole of the supply voltage, it is advantageous if the first transistor element and the second transistor element are normally-off N-MOSFET transistor elements, with the gate connection corresponding to the control input, the source connection corresponding to the input of the switching means and the drain connection of the transistor element corresponding to the output of the switching means.

In this case, it is advantageous if, in a circuit which connects the load to a positive or to a negative pole of the supply voltage, the method of operation of the means for providing the electrical control variable for the second switching means can be represented in accordance with the following Boolean equation:

$$V_{gate2} = V_{gate1} + \overline{V_{drain1}} \tag{1a}$$

or, $$V_{gate2} = \overline{V_{gate1}} + V_{drain1}, \tag{1b}$$

where the Boolean variable, $V_{gate2}$ describes the digital voltage between the gate connection of the second transistor element and earth, the Boolean variable $V_{gate1}$ describes the digital voltage between the gate connection of the first transistor element and earth, and the Boolean variable $V_{drain1}$ describes the digital voltage between the drain connection of the first transistor element and earth. A means whose operation can be represented on the basis of the Boolean equation (1a) ensures that, from a specific threshold voltage between the two digital states of the voltage $V_{drain1}$ which is formed during switching on, the voltage $V_{gate2}$ is switched to the digital L value (low) so that the second transistor element is switched on. The additional dependency of the control variable $V_{gate2}$ for the second transistor element of the control variable $V_{gate1}$ for the first transistor element and thus on the switching variable according to equation (1a) as well, ensures that the second transistor element is also switched off when the first transistor element is switched off during the process of switching off the load by switching over the control variable $V_{gate1}$. If the control variable $V_{gate2}$ for the second transistor element were to be independent of the control variable $V_{gate1}$ for the first transistor element, and thus also independent of the switching variable, it would not be possible to switch the second transistor element off, since the voltage $V_{drain1}$, and hence the second transistor element, would not be influenced when the first transistor element was switched off. The above statements relating to the equation (1a) can be transferred in an analogous manner to the equation (1b) for a circuit which connects the load to a negative pole of the supply voltage. The equations (1a) and (1b) can be transformed to equivalent equations which operate in the same way, by means of appropriate Boolean transformations. Furthermore, for the purposes of the invention, it is, of course, feasible, rather than using the voltage $V_{drain1}$ for the implementation of the circuit, also to use a different voltage which is correlated to it and which occurs on the output side of the drain connection of the first transistor element, for example between the second drain connection of the second transistor element and earth. In the same way, in the sense according to the invention, it is feasible, rather than using the voltage $V_{gate1}$ also to use a voltage which is correlated to it, for example the switching voltage for switching the load on and off.

If the means according to the invention operates in accordance with the equation (1a) it is advantageous for the means for providing the electrical control variable for the second switching means to have an inverter and an OR gate. In this case, the drain connection of the first transistor element is electrically connected to one input of the inverter, the gate connection of the first transistor element is electrically connected to a first input of the OR gate, the output of the inverter is electrically connected to a second input of the OR gate, and the output of the OR gate is electrically connected to the gate connection of the second transistor element. Furthermore, it is also possible to use a special combined gate, which is based on an OR gate in which, however, one input is inverted with respect to the other input.

According to one advantageous embodiment of a circuit which connects the load to a positive pole of the supply voltage, the means for providing the electrical control variable for the second switching means has a normally-off P-MOSFET transistor element. This acts as an inverter, with the gate connection being electrically connected to the drain connection of the first transistor element, and with the inverter being used to drive the second transistor element. The use of a P-MOSFET transistor element connected in this way is advantageous when the means according to the invention for determination of the gate voltage of the second transistor element additionally has a normally-off N-MOSFET transistor element, whose gate connection is electrically connected to the drain connection to the first transistor element, and which is used to drive the second transistor element. An N-MOSFET transistor element such as this is located on the input side in a gate of the means according to the invention, for example in an NMOS inverter or CMOS inverter, and governs the input-side switching voltage of the gate via the so-called threshold voltage $U_{th}$ of that N-MOSFET transistor element. The two transistor elements, the additional P-MOSFET transistor element and the N-MOS transistor element which is located in the logic circuit (and in conjunction with the logic circuit) control the potential at the gate connection of the second transistor element, which is used as a switching means, when the load is switched on. The second switching means is not switched on until both the P-MOSFET transistor element and the logic circuit which is arranged parallel with it have been switched over. Since the P-MOSFET transistor element switches over later than the logic circuit, the additional P-MOSFET transistor element further delays the time at which the second switching means is switched on. This measure therefore reduces the maximum charging current. According to one embodiment of a circuit which connects the load to a negative pole of the supply voltage, and which embodiment is likewise advantageous, the means for providing the electrical control variable for the second switching means has a normally-off N-MOSFET transistor element. This acts as an inverter, with the gate connection being electrically connected to the drain connection of the first transistor element, and with the inverter being used to drive the second transistor element. The use of an N-MOSFET transistor element connected in this way is advantageous when the means according to the invention for determining the gate voltage of the second transistor element also has a normally-off P-MOSFET transistor element whose gate connection is electrically connected to the drain connection of the first transistor element, and which is used to drive the second transistor element. The additional P-MOSFET transistor element delays the time at which the second switching means is switched on, as in the case of the circuit for connection of the positive pole of the supply voltage.

It is advantageous for the circuit to have one or more further switching means, which are each arranged in paths in parallel with the paths of the first and second switching means and which are closed with a fixed and in each case different delay with respect to the first two switching means. This offers the advantage that a circuit such as this has better characteristics, in particular a lower resistance $R_{on}$. If the supply voltage has already been entirely or approximately applied to the internal supply voltage node after the second switching means has been switched on, then the resistance $R_o$ of the circuit is reduced when further parallel switching means are switched on after a delay, in particular very large-area transistor elements, with no additional charging current, or only a small amount of additional charging current occurring.

According to one preferred embodiment, the circuit is in the form of a monolithically integrated semiconductor circuit on a common semiconductor substrate. In this case, it is advantageous for both the circuit and the load which can be connected downstream from the circuit to be manufactured as a monolithically integrated semiconductor circuit on a common semiconductor substrate. A circuit such as this is particularly advantageous when, in addition to the circuit and the load which can be connected downstream from the circuit, a further circuit block is also in the form of a monolithically integrated semiconductor circuit on the common semiconductor substrate, with this circuit block being intended to receive the same pole of the supply voltage which can be connected upstream. The circuit according to the invention produces the charging current when switching on the downstream load. The available supply voltage and the signal-to-noise ratio of a further circuit block are thus influenced only insignificantly by switching on the load on the circuit according to the invention.

The method according to the invention for switching on an electrical load comprises the following steps: first of all, one pole of a supply voltage is electronically connected to the electrical load via a first switching means in a first path. An electrical variable which occurs on the output side of the first switching means is then measured. Finally, the same pole of the supply voltage is electronically connected to the electrical load via a second switching means in a second path, which is in parallel with the first path, as a function of the electrical variable which occurs on the output side of the first switching means.

Further advantageous refinements of the invention are specified in the dependent claims.

BRIEF DESCRIPTION OF THE DRAWINGS

The invention will be explained in more detail in the following text using two exemplary embodiments and with reference to the drawing, in which.

DETAILED DESCRIPTION OF THE PREFERRED EMBODIMENTS

Figure 1:
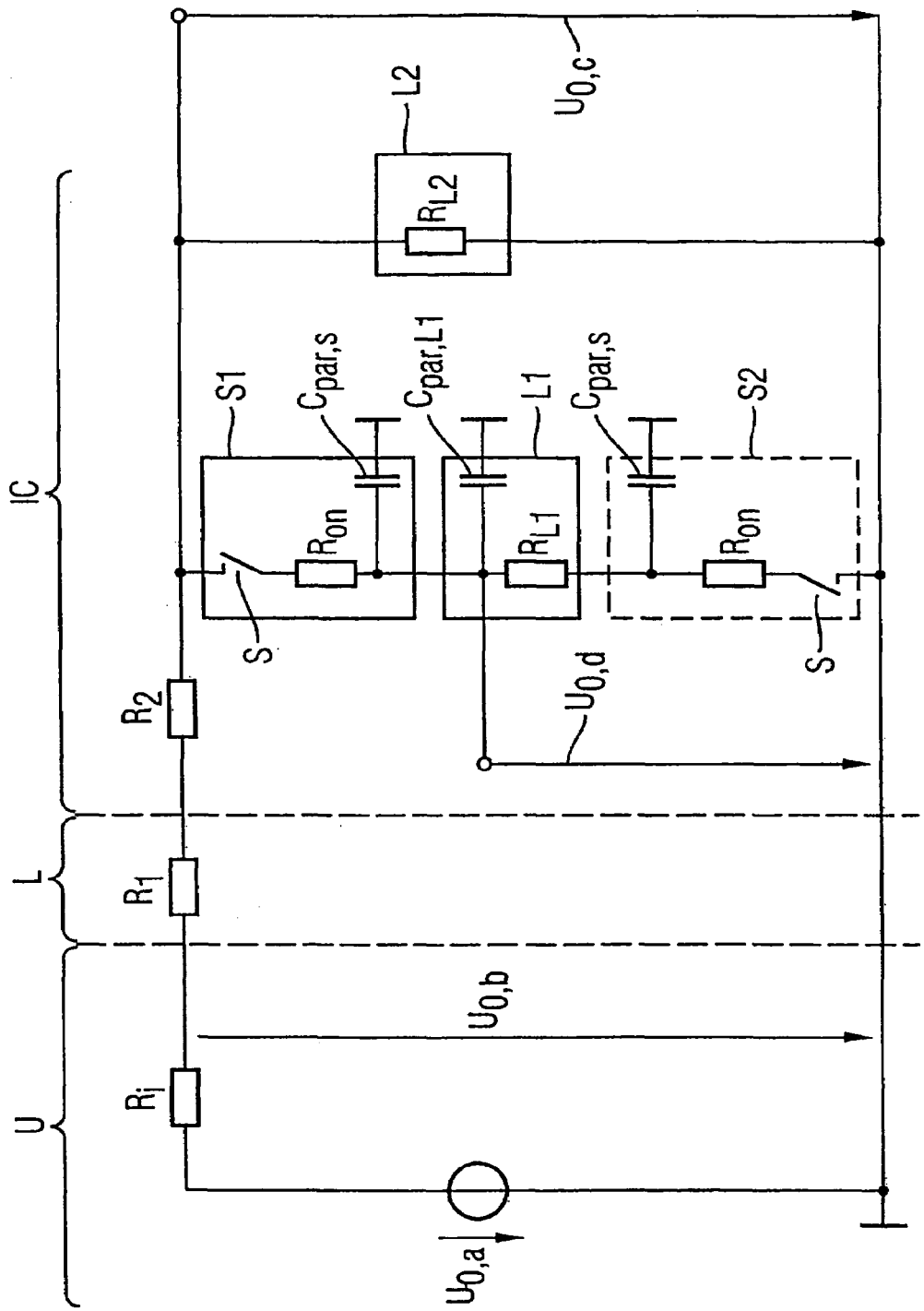
FIG. 1 shows an illustration of the typical drive and load conditions in the circuit according to the invention.

FIG. 1 shows an illustration of the typical drive and load conditions in the circuit according to the invention, using equivalent switching elements. A voltage source U, for example a battery or a rechargeable battery, whose no-load voltage $U_{0,a}$ is in this case used to supply the downstream circuit blocks. The voltage source internally has an internal resistance $R_i$. A resultant voltage $U_{0,b}$, that is to say a voltage external to the voltage source, is produced at the output of the voltage source. The output of the voltage source U is connected to a printed circuit board L. In this case, the printed circuit board L has an equivalent resistance $R_1$ between the input and the output. This describes the line losses on the printed circuit board and the resistance of a bonding connection by corresponding bonding wires. On the output side, the printed circuit board is connected to a monolithically integrated circuit IC which, on the input side, has an equivalent resistance $R_2$, which describes a chip-internal line resistance between one or more bonding pads and the common supply voltage node for two circuit blocks L1 and L2. The output of the equivalent resistance $R_2$ is connected to two parallel-connected paths, which comprise the two locally adjacent circuit blocks L1 and L2, defined by their equivalent resistances $R_{L1}$ and $R_{L2}$, respectively. A circuit for switching on the electrical load L1 is located between the resistance $R_2$ and the circuit block L1 in the first path, and connects the positive pole on the supply voltage U to the corresponding connection with the load L1, in order to switch on the load L1. As equivalent elements, the circuit S1 has a switch S, an equivalent resistance, $R_{on}$ and a parasitic switching capacitance $C_{par,S}$. The circuit block L1 furthermore has a parasitic capacitance $C_{par,L1}$, which is specific to one circuit block. Furthermore, a circuit S2 of similar design is shown, which may be used instead of the circuit S1 for switching on the circuit block L1. When using the circuit S2, the negative pole of the supply voltage U, in this case earth, is connected to the corresponding connection of the load L1, in order to switch on the load L1. If the switch S1 is used to switch on the load L1, S2 must be replaced by a short. The voltage between the input of the switch S1 and earth is annotated $U_{0,C}$, and the load-internal supply voltage for L1 is annotated $U_{0,d}$.

Before the circuit block L1 is switched on, the voltage $U_{0,d}$ is approximately zero. On being switched on, by closing the switch S in the circuit S1, the charge in the network capacitances $C_{par,L1}$ and $C_{par,S}$ must be changed. The change in charge is in this case proportional to the magnitude of the capacitances $C_{par,L1}$ and $C_{par,S}$. The rate of change corresponds to a charging current or charge-changing current. This is provided from the voltage source $U_{0,a}$ and flows through the equivalent resistances $R_i$, $R_1$ and $R_2$. An additional voltage is briefly dropped across these equivalent resistances, and results in the voltage $U_{0,c}$ being reduced during the charging process. This voltage change acts directly on the circuit element L2, whose supply voltage decreases by the magnitude of the voltage change, which may considerably adversely affect the operation of the circuit element L2, depending on the amount of the voltage dip.

Figure 2:
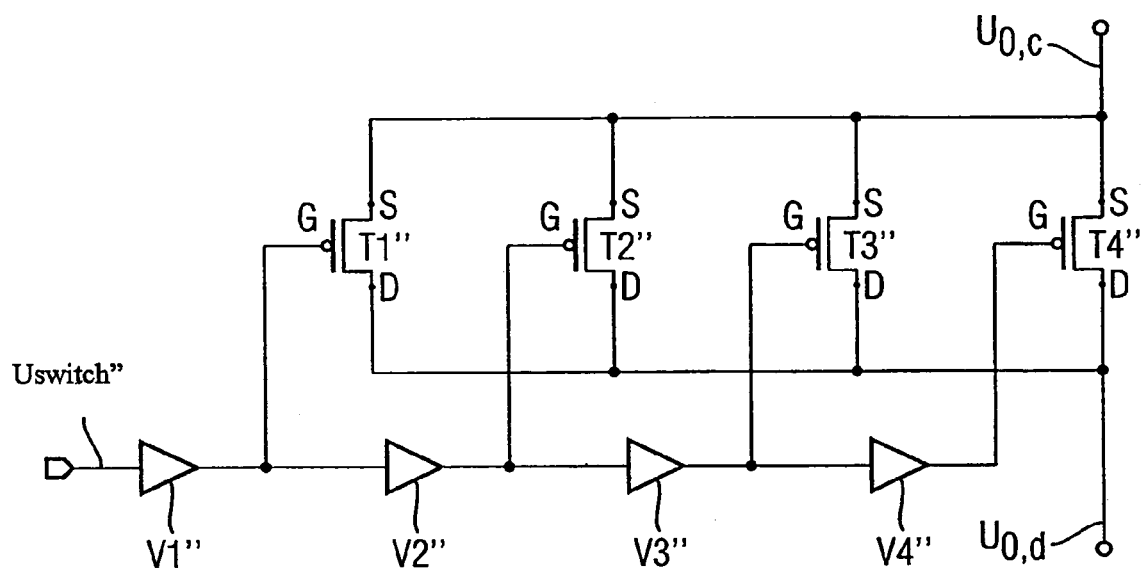
FIG. 2 shows an illustration of a self-evident circuit for switching on a load.

FIG. 2 shows a self-evident implementation of the circuit S1 for switching on the downstream load, which results in a reduction in the charging current in comparison to the use of only one large switching transistor. The nodes $U_{0,c}$ and $U_{0,d}$ are associated with the voltages with the same names in FIG. 1. In this implementation, the switch S is formed by four smaller normally-off P-MOSFET transistors T1"–T4", which are arranged in four parallel paths. The P-MOSFET transistors T1"–T4" are driven by a voltage $U_{switch}$", which is supplied as a switching variable from outside the circuit. Throughout the following description, the same reference symbol is in each case used to denote both a node and the potential at that node. The voltage $U_{switch}$" is supplied to a chain of delay elements V1"–V4", whose outputs each drive a gate connection of a transistor. In this case, the voltage $U_{switch}$" in general represents a digital voltage, whose value in the L (low) state corresponds to the earth potential, and whose value in the H (high) state corresponds to the supply voltage. Other voltage values may also be used for other digital states.

In principle, the circuit shown in FIG. 2 is based on the idea of delaying the switching-off process so as to reduce the charging current. In this case, the delay is produced by the delay elements V1"–V4". Once the voltage $U_{switch}$" has been switched from the H value to the L value, which is associated with the load being switched on, the gate potential on the individual transistors changes with a fixed time delay, which results from the fixed time delay of the individual delay elements V1"–V4". In this case, the gate potential of T1" first of all changes from the H value to the L value. This potential change switches on the transistor T1" corresponding to the method of operation of a normally-off P-MOSFET transistor; this results in a conductive connection between the source and the drain connections of T1", and thus also between the node $U_{0,c}$ and $U_{0,d}$. The three further transistors are each switched on with a time delay with respect to one another, in an analogous manner. The disadvantages of an implementation such as this have already been described in detail in the introduction to the description.

Figure 3:
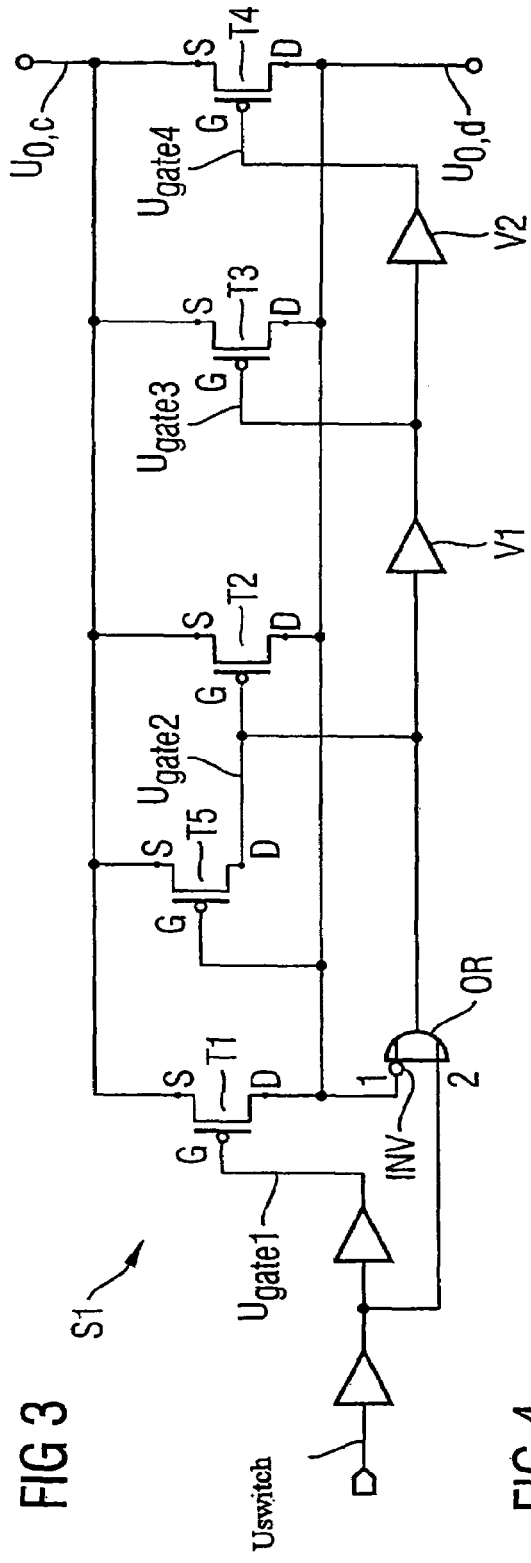
FIG. 3 shows an illustration of a first exemplary embodiment of the circuit according to the invention for switching on a load.

FIG. 3 shows an illustration of a first exemplary embodiment of the circuit according to the invention for switching on a load. In this case, as in the implementation shown in FIG. 2, four normally-off P-MOSFET transistors T1–T4 are used as switches in four parallel paths between the nodes $U_{0,c}$ and $U_{0,d}$. The switching variable $U_{switch}$ is used in the same way as $U_{switch}$" in FIG. 2 to switch on the downstream load. In this case, the gate potential of T1 is influenced directly by the switching variable $U_{switch}$, without any significant time delay. The gate potential of T2 is controlled via a logic circuit, with an inverter INV driving just one input of an OR gate OR. The output of the OR gate OR determines the potential $U_{gate2}$ at the gate connection of T2. The input of the inverter INV, and thus one input of the downstream OR gate are, according to the invention, determined by the potential $U_{0,d}$ from the output of the circuit and, respectively, at the load-internal supply voltage node. The second input of the OR gate is switched via the voltage $U_{switch}$. The gate connections $U_{gate3}$ and $U_{gate4}$ are connected via the respective delay elements V1 or V1 and V2 to the output of the OR gate.

The operation of the P-MOSFET transistor T5, which is illustrated in FIG. 3, will initially be ignored in the description of the circuit in the following text. Before the load L1 is switched on, the voltage $U_{switch}$ is at the H value. The output potential in the circuit $U_{0,d}$ has the value zero, since a connection with a generally relatively high impedance via $R_{L1}$ occurs through the switched-off load L1. The value of $R_{L1}$ in the switched-off state is generally higher than when L1 is in the switched-on state. If the value of the switching variable $U_{switch}$ changes from the H state to the L state in order to switch on the load L1 which is connected downstream from the circuit according to the invention, the potential at the gate connection of T1 first of all falls to the L value. If the magnitude of the negative voltage between the gate and source connections $U_{GS,T1}$ is in the region of the magnitude of the threshold value $U_{th,T1}$ of T1, then this increasingly results in an electrical connection between the source connection and the drain connection of T1. This initiates a charging process for the output-side node $U_{0,d}$ of the circuit S1, so that the potential $U_{0,d}$ at the node with the same name increases, starting from the value zero in the direction of the potential $U_{0,c}$ at the node which likewise has the same name. The current which is required for charging or for changing the charge at the node is passed via the transistor T1. If the potential $U_{0,d}$ is in the region of the threshold voltage of the inverter INV, the output of the inverter NV changes from the H state to the L state. In the process, the threshold voltage, that is to say the voltage at which the output switches from the H state to the L state, is governed primarily by the threshold voltage $U_{th}$ and the type of input transistor in the inverter NV. If the inverter INV is formed by NMOS or CMOS gates, then this converter NV generally switches even at a voltage of $U_{0,d}=U_{th}$ of 400 to 500 mV, as a result of an N-MOSFET transistor being switched on. As a result of the switching of the inverter INV, the output of the OR gate OR changes to the L value, as does the potential of the gate connection of T2. The second input of the OR gate OR has no function during switching on. When the potential $U_{gate2}$ changes to the L value, this results in an additional connection being formed via the transistor T2 between the input and the output of the circuit. In this case, the maximum current which flows between the source connection and drain connection T2 is additionally limited because the magnitude of the voltage $U_{DS,T2}$ between the drain connection and the source connection T2 is small. When T2 is switched on, the magnitude of this voltage becomes $U_{0,c}$ minus the threshold value $U_{th,INV}$ of the inverter. Once the transistor T2 has been switched on, the further transistors T3 and T4 are switched on after the delay produced by the delay element V1 or by the delay elements V1 and V2, respectively, in a similar manner to that shown in FIG. 2.

The operation of the optionally normally-off P-MOSFET transistor T5 will now be considered in the following text. This is used to drive the gate connection T2, in parallel with the gates INV and OR. In this case, the gate connection is connected to the output node $U_{0,d}$ of the circuit, the source connection is connected to the source connections of the other transistors T1 to T4, and the drain connection is connected to the gate connection of T2. When T1 is switched on, the digital function of T5 acts in a similar way to that of the inverter INV. Once the potential $U_{0,d}$ after T1 has been switched on reaches the threshold voltage of the inverter INV, the output of the inverter INV changes from the H state to the L state, as already mentioned. The transistor T5 is switched on at this time, as before as well, since the magnitude of the gate/source voltage $U_{GS,T5}$ of T5 is still greater than the magnitude of the threshold value $U_{th,T5}$ of the transistor T5. This means that the transistor T5 draws the potential $U_{gate2}$ in the direction of the supply voltage $U_{0,c}$, that is to say in the direction of the H value, while, in contrast, the output of the OR gate—as already mentioned—forces the potential $U_{gate2}$ in the direction of earth, that is to say in the direction of the L value. In this case, T5 and the OR gate may be chosen skillfully to ensure that T5 is dominant with respect to the potential of the gate connection of T2, $U_{gate2}$, during the switching-on process. This means that the potential $U_{gate2}$ does not change from the H value to L value approximately until the potential $U_{0,d}$ at the output of the circuit satisfies the following expressions:

$$U_{0,d} > U_{th,T5} + U_{0,c} \text{ and } U_{0,d} > U_{th,INV} \qquad (1).$$

If, by way of example $U_{th,T5}=-500$ mV, $U_{th,INV}=+500$ mV and $U_{0,c}=1200$ mV, then the potential $U_{gate2}$ does not switch from the H value to the L value until $U_{0,d}$ is in the order of magnitude of 700 mV. The use of T5 thus further delays the time at which the transistor T2 is switched on.

When the potential $U_{switch}$ changes from the L value to the H value while the low L1 is being switched off, the gate/source voltage of T1 becomes approximately zero, which means that the transistor T1 is switched off. However, contrary to the switching-on process, switching the transistor T1 off has no influence on the switching state of the transistors T2 to T4. During switching off, the function of the OR gate, in particular of the second input of the OR gate, is required. When the potential $U_{switch}$ switches from the L value to the H value, the output of the OR gate switches to the H value, irrespective of the potential $U_{0,d}$ and the output potential of the inverter INV. Since the transistor T5 is switched off, this does not counteract the OR gate when switching off L1. The switching of the output of the OR gate results in the transistor T2 being switched off, and in the transistors T3 and T4 also being switched off with the appropriate delay, so that there is no conductive connection between the nodes $U_{0,c}$ and $U_{0,d}$ via T1 to T4, and the potential $U_{0,d}$ falls to the earth potential, as a result of the leakage current in the load circuit L1.

When choosing the transistors T1 to T4, care must be taken to ensure that, during the switching-on process, the change in the charge at the node should be carried over as wide a voltage range as possible by small transistors with a low switching capacitance, so that the maximum charging current is small. During steady-state operation of the circuit L1, the resistance $R_{on}$ of the circuit should be as low as possible, so that the transistors which are switched on last should be as large as possible. An advantageous design of the circuit corresponding to this provides for the following dimensions: $b_{T1}=50$ µm, $b_{T2}=400$ µm, $b_{T3}=3000$ µm and $b_{T4}=3000$ µm for the channel widths $b_{T1-T4}$ of the individual transistors T1 to T4.

The form of the logic circuit shown in FIG. 3 represents only one possibility. For the purposes of the invention, it is feasible for the logic circuit comprising the inverter INV and the OR gate OR to be replaced by a circuit which operates in a logically equivalent manner, for example based on a NAND gate. Furthermore, with regard to the switching logic for the switching variable $U_{switch}$, it would also be possible to agree for the load L1 to be switched from the L value to the H value when the switching variable $U_{switch}$ changes. This could be achieved, for example, by means of an additional inverter.

Figure 4:
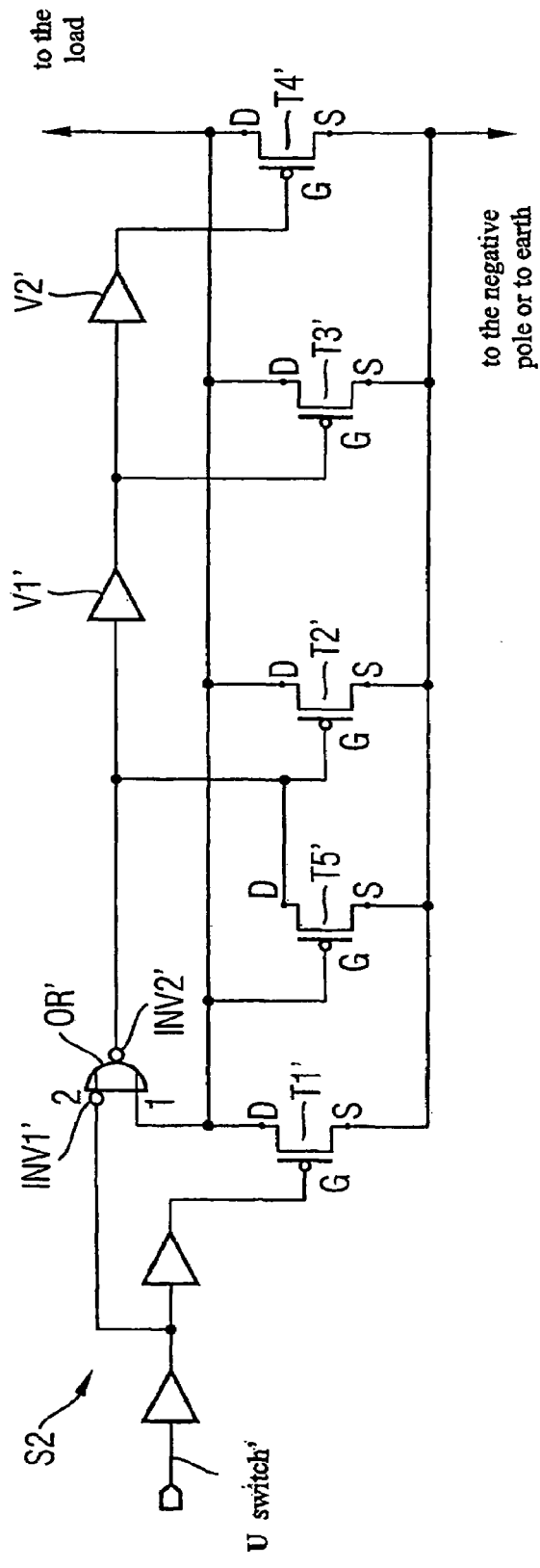
FIG. 4 shows an illustration of a second exemplary embodiment of the circuit according to the invention for switching on a load.

FIG. 4 shows a second exemplary embodiment of the circuit according to the invention for switching on a load L1. This relates to the implementation of a switch S2 as shown in FIG. 1, which connects the load L1 to the negative pole, in this case to earth, during the switching-on process. In this case, four normally-off N-MOSFET transistors T1'–T4' are used as switches in four parallel paths, instead of the configuration shown in the circuit shown in FIG. 3. The drain connections of the transistors are connected to the load-side negative supply voltage connection and to the earth connection of the load L1, respectively, while the source connections of the transistors are connected to the negative pole of the supply voltage and to earth, respectively. Furthermore, a logic circuit which is not the same as that in FIG. 3 is used to drive the gate connections of the transistors T2'–T4'. In this case, the load-side output of the circuit is connected directly to the first connection of an OR gate OR', without an inverter. Furthermore, the second input of the OR gate OR' is driven by the switching variable $U_{switch}'$ via an additional inverter INV1'. In addition, the output of the OR gate is inverted via a further inverter INV2' whose output determines the gate potentials of the transistors T2' to T4' directly (T2') or indirectly (T3' and T4') via the additional delay elements V1' and V2'. Furthermore, a normally-off N-MOSFET transistor T5' is optionally provided, which, in an analogous manner to the P-MOSFET transistor T5 in FIG. 3, delays the switching of the gate potential of T2'—caused by the gate circuit INV2' and OR'—and hence delays the switching on of the transistor T2'. The gate potential of T2' then rises from the initial L value to the H value, when the gate/source voltage of T5' and hence—when using earth as the negative pole of the supply voltage—the output of the circuit falls below the threshold voltage of T5'. In contrast to the first exemplary embodiment shown in FIG. 3, this exemplary embodiment uses different logic for the switching variable $U_{switch}'$. In this case, the change in the switching variable $U_{switch}'$ from a logic L value to a logic H value is used to switch on the load L1. It would be feasible to use the same switching logic; in this case, the inverter INV1' would have to be shifted from the second input of the OR gate OR' to the gate connection of the transistor T1'. Furthermore, it is also feasible to replace the gate OR' and INV2' by a corresponding NOR gate, and use a logic circuit which operates in a logically equivalent manner, for example based on AND gates or NAND gates instead of OR gates. The circuit shown in FIG. 4 operates analogously to the operation of the circuit shown in FIG. 3, and all that need be remembered is that the N-MOSFET transistors T1' to T4' switch on when the gate potential of the respective transistor is greater than the threshold voltage of the transistor.

Figure 5:
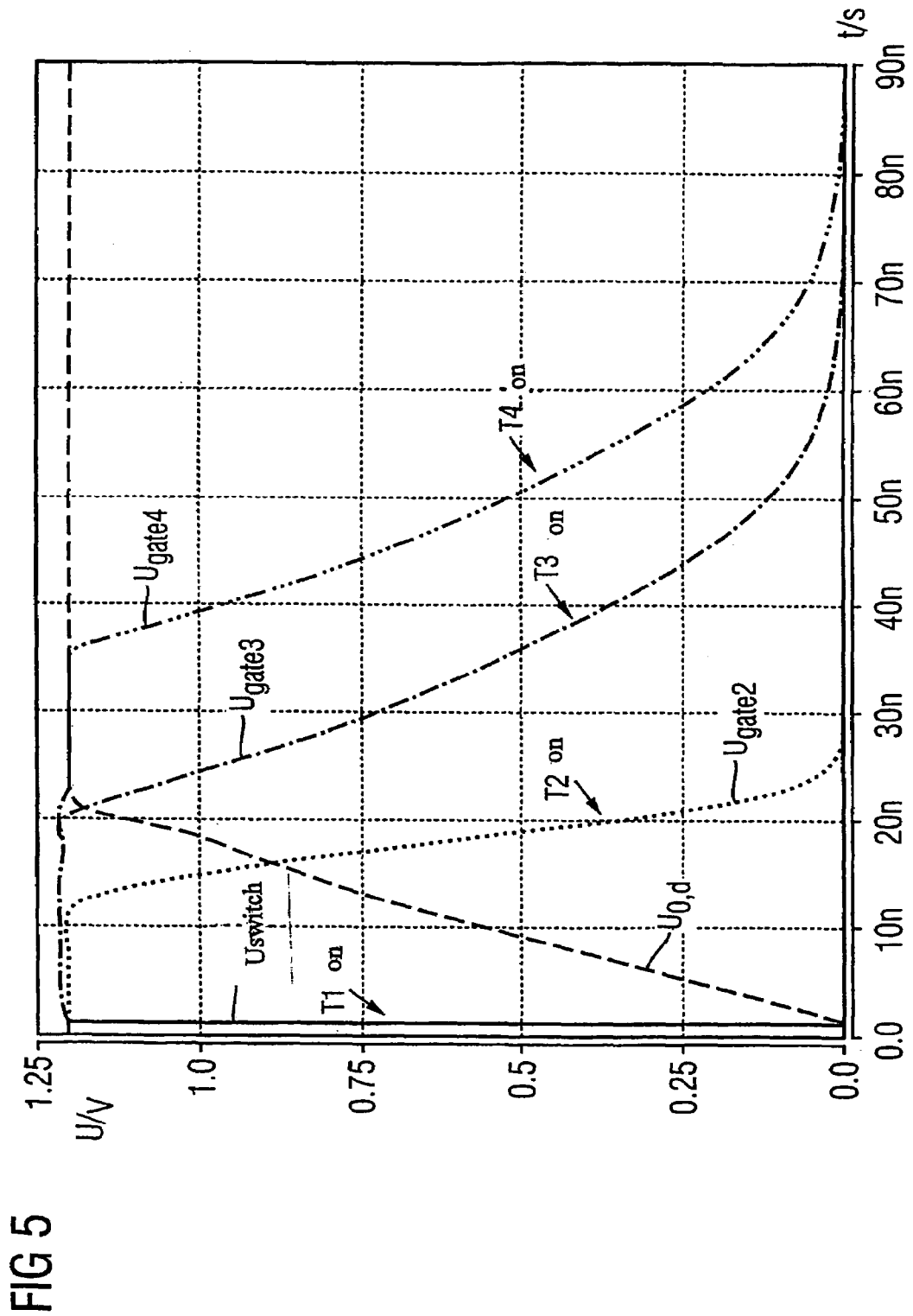
FIG. 5 shows an illustration of the transient response of the circuit shown in FIG. 3, based on a simulation result.

FIG. 5 shows the transient response of the circuit shown in FIG. 3, based on a simulation result. In this case, the solid line describes the profile of the potential of the switching variable $U_{switch}$, the dashed line describes the profile of the potential $U_{0,d}$ at the output node of the circuit, and the dotted line describes the profile of the gate potential $U_{gate2}$ of T2. Furthermore, the illustration shows the profiles of the gate potentials $U_{gate3}$ and $U_{gate4}$ of the transistors T3 and T4, respectively.

At the start of the process of switching L1 on, the transistor T1 is switched on when the switching variable $U_{switch}$ is switched from the H value to the L value, that is to say from 1200 mV to 0 V at the time t≈3 ns. This results in the drain potential, and hence the output potential of the circuit $U_{0,d}$, rising from 0 V. When the potential $U_{0,d}$ reaches a value of approximately 650 mV (at the time t ≈12 ns), the gate potential $U_{gate2}$ of the second transistor decreases. The circuit which drives the gate connection of T2 starts to slowly change the transistor T2 from the switched-off to the switched-on state. Once the value of $U_{gate2}$ goes beyond about 500 mV (at the time t≈18 ns), the impedance of the transistor T2 becomes very low; the output potential of the circuit $U_{0,d}$ rises steeply up to a final value of 1200 mV. Finally, the gate potential $U_{gate3}$ of the transistor T3 also starts to decrease at the time t≈19 ns, as a result of the use of the delay element V1. The output potential of the circuit $U_{0,d}$ reaches the steady-state value of 1200 mV at approximately t≈23 ns. After reaching the steady-state value, the gate potential $U_{gate4}$ of the transistor T4 also starts to decrease, because of the additional delay produced by the delay element V2. The switching-on process is finally complete approximately at the time t≈90 ns.

I claim:

1. A circuit for switching on an electrical load which can be connected downstream from the circuit, comprising:
    a first transistor having a first load path and at least a second transistor having a second load path coupled in parallel with the first load path, wherein a first node of the parallel load paths is coupled with said electrical load and a second node of the parallel load paths is coupled with a terminal of a power supply;
    a third transistor having a third load path coupled between the first node of the parallel load paths and a control input of the second transistor, wherein the control input of the third transistor is coupled with the second node of the parallel load paths;
    a logic circuit comprising a first input receiving a switching control signal fed to a control input of said first transistor, comprising a second input coupled with said first node of said parallel load paths, and comprising an output coupled with the control input of said second transistor.

2. The circuit according to claim 1, wherein the logic circuit comprises an OR gate and an inverter coupled between the second input of the logic circuit and a first input of the OR gate.

3. The circuit according to claim 1, wherein the logic circuit comprises an NOR gate and an inverter coupled between the first input of the logic circuit and a first input of the NOR gate.

4. The circuit according to claim 1, wherein the first transistor element has a lower switching capacitance than the second transistor element.

5. The circuit according to claim 1, wherein the transistor elements are of the same transistor type and the first transistor element has a smaller size than the second transistor element in particular comprises a size which is smaller by a factor of at least 2.

6. The circuit according to claim 2, further comprising first and second drivers coupled in series and receiving said switching signal and outputting a signal fed to said control input of the first transistor.

7. The circuit according to claim 1, wherein the first, second, and third transistors are PMOS transistors.

8. The circuit according to claim 1, wherein the first, second, and third transistors are NMOS transistors.

9. The circuit according to claim 1, further comprising a fourth transistor having a load path coupled in parallel to said parallel load paths and having a control input coupled with the output of said logic circuit.

10. The circuit according to claim 9, further comprising a driver coupled between the output of the logic circuit and the control input of the fourth transistor.

11. The circuit according to claim 10, comprising a plurality of fourth transistors whose load paths are coupled in parallel and a plurality of drivers coupled in series.

12. The circuit according to claim 1, wherein the circuit is in the form of a monolithically integrated semiconductor circuit on a common semiconductor substrate.

13. The circuit according to claim 12, wherein both the circuit and the load which can be connected downstream from the circuit are in the form of a monolithically integrated semiconductor circuit on a common semiconductor substrate.

14. The circuit according to claim 13, wherein, in addition to the circuit and the load which can be connected downstream from the circuit, a further circuit block is also in the form of a monolithically integrated semiconductor circuit on the common semiconductor substrate, with this circuit block being provided for receiving the same pole of the supply voltage which can be connected upstream.

15. A method for switching on an electrical load, comprising the steps of:
    a) electronic connection of one pole of a supply voltage to the electrical load via a first transistor in a first path,
    b) measuring an electrical variable which occurs on the output side of the first transistor, and
    c) electronic connection of the same pole of the supply voltage to the electrical load via a second transistor in a second path, which is in parallel with the first path, as a function of the electrical variable which occurs on the output side of the first switching means, wherein in addition a control input of the second transistor is coupled through the load path of a third transistor with said pole of the power supply and controlling said third transistor via said electrical variable.

16. The method according claim 15, wherein the electrical variable which occurs on the output side of the first switching means is an electrical potential.

17. The method according claim 16, wherein the pole of the supply voltage is connected to the voltage supply connection of the electrical load in accordance with method step c) when a specific threshold value of the electrical potential which occurs on the output side of the first switching means is reached.

18. The method according claim 17, wherein
in a method in which the load is connected to a positive pole of the supply voltage, the pole of the supply voltage is connected to the electrical load in accordance with method step c) when the threshold value is exceeded, and
in a method in which the load is connected to a negative pole of the supply voltage, the pole of the supply voltage is connected to the electrical load in accordance with method step c) when the threshold value is undershot.

19. The method according claim 15, comprising the following step:
d) electronic connection of the same pole of the supply voltage to the electrical load via one or more further paths which are in parallel with the first path and the second path, with the connection being carried out with a fixed and in each case different delay with respect to the connection in accordance with method step c).

20. A circuit for switching on an electrical load which can be connected downstream from the circuit, comprising:
a first transistor controlled by a first switching signal having a first load path and at least a second transistor having a second load path coupled in parallel with the first load path, wherein a first node of the parallel load paths is coupled with said electrical load and a second node of the parallel load paths is coupled with a terminal of a power supply;
a third transistor having a third load path coupled between the first node of the parallel load paths and a control input of the second transistor, wherein the control input of the third transistor is coupled with the second node of the parallel load paths;
a logic circuit providing a second switching signal to control said second transistor derived from the first switching signal and an electrical variable which occurs at the first node of said parallel load paths, wherein the second switching signal is delayed with respect to said first switching signal.

21. The circuit according to claim 20, wherein the logic circuit comprises an OR gate and an inverter coupled between an input of the logic circuit and a first input of the OR gate.

22. The circuit according to claim 20, wherein the logic circuit comprises an NOR gate and an inverter coupled between the first input of the logic circuit and a first input of the OR gate.

* * * * *

UNITED STATES PATENT AND TRADEMARK OFFICE
CERTIFICATE OF CORRECTION

PATENT NO. : 7,183,816 B2  Page 1 of 1
APPLICATION NO. : 10/997206
DATED : February 27, 2007
INVENTOR(S) : Martelloni Yannick It is certified that error appears in the above-identified patent and that said Letters Patent is hereby corrected as shown below:

In the Claims:

In Claim 6, column 14, line 28, "fed" should read --feed--

Signed and Sealed this

Thirteenth Day of November, 2007

JON W. DUDAS
*Director of the United States Patent and Trademark Office*